(12) United States Patent
Habib et al.

(10) Patent No.: US 8,114,686 B2
(45) Date of Patent: Feb. 14, 2012

(54) PHASE CHANGE MATERIAL BASED TEMPERATURE SENSOR

(75) Inventors: Nazmul Habib, South Burlington, VT (US); Chung Hon Lam, Peekskill, NY (US); Robert McMahon, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/819,721

(22) Filed: Jun. 21, 2010

(65) Prior Publication Data

US 2010/0254425 A1    Oct. 7, 2010

Related U.S. Application Data

(62) Division of application No. 11/771,033, filed on Jun. 29, 2007, now Pat. No. 7,795,605.

(51) Int. Cl.
G01N 25/02    (2006.01)
G01R 31/26    (2006.01)

(52) U.S. Cl. ............... 438/14; 438/17; 438/18; 374/21; 257/467

(58) Field of Classification Search ............ 438/14, 438/17, 18; 257/467–470, E21.068, E45.002; 374/21

See application file for complete search history.

(56) References Cited

U.S. PATENT DOCUMENTS

| | | | |
|---|---|---|---|
| 4,630,355 A | 12/1986 | Johnson | |
| 5,893,732 A * | 4/1999 | Morgan | 438/238 |
| 6,157,244 A | 12/2000 | Lee et al. | |
| 6,294,923 B1 | 9/2001 | Blish, II et al. | |
| 6,335,069 B1 * | 1/2002 | Ogawa et al. | 428/64.1 |
| 6,448,576 B1 * | 9/2002 | Davis et al. | 257/50 |
| 6,625,054 B2 * | 9/2003 | Lowrey et al. | 365/148 |
| 6,813,177 B2 | 11/2004 | Lowrey et al. | |
| 6,936,840 B2 * | 8/2005 | Sun et al. | 257/30 |
| 6,954,394 B2 | 10/2005 | Knall et al. | |
| 6,969,869 B2 | 11/2005 | Hudgens et al. | |
| 7,005,665 B2 | 2/2006 | Furkay et al. | |
| 7,020,014 B2 * | 3/2006 | Khouri et al. | 365/163 |
| 7,067,837 B2 | 6/2006 | Hwang et al. | |
| 7,123,535 B2 | 10/2006 | Kurotsuchi et al. | |
| 7,135,656 B2 | 11/2006 | Timans | |

(Continued)

FOREIGN PATENT DOCUMENTS

JP    62-256114    11/1987

(Continued)

*Primary Examiner* — Long Tran
*Assistant Examiner* — Jordan Klein
(74) *Attorney, Agent, or Firm* — Scully, Scott, Murphy & Presser, P.C.; David Cain, Esq.

(57) ABSTRACT

A block of phase change material located in a semiconductor chip is reset to an amorphous state. The block of phase change material may be connected to an internal resistance measurement circuit that can transmit the measured resistance data to input/output pads either in an analog output format or in a digital output format. Depending on the ambient temperature, the resistance of the block of phase change material changes. By measuring a fractional resistance change compared to the resistance of the phase change material at a calibration temperature, the temperature of the region around the phase change material can be accurately measured. A logic decoder and an input/output circuit may be employed between the internal resistance measurement circuit and the input/output pads. A plurality of temperature sensing circuits containing phase change material blocks may be employed in the semiconductor chip to enable an accurate temperature profiling during chip operation.

19 Claims, 14 Drawing Sheets

U.S. PATENT DOCUMENTS

| | | |
|---|---|---|
| 7,459,266 B2 * | 12/2008 | Sun et al. ............... 430/319 |
| 7,460,394 B2 * | 12/2008 | Happ et al. ............. 365/163 |
| 7,521,372 B2 | 4/2009 | Chen |
| 7,623,401 B2 * | 11/2009 | Philipp et al. ........... 365/222 |
| 2004/0051094 A1 | 3/2004 | Ooishi |
| 2004/0179414 A1 | 9/2004 | Hsu |
| 2005/0035342 A1 | 2/2005 | Chen |
| 2005/0051901 A1 | 3/2005 | Chen |
| 2005/0127350 A1 | 6/2005 | Furkay et al. |
| 2005/0174861 A1 | 8/2005 | Kim et al. |
| 2005/0184282 A1 | 8/2005 | Lai et al. |
| 2005/0265072 A1 | 12/2005 | Hart et al. |
| 2006/0034116 A1 | 2/2006 | Lam et al. |
| 2006/0278899 A1 | 12/2006 | Chang et al. |

FOREIGN PATENT DOCUMENTS

| | | |
|---|---|---|
| WO | 2006/107571 | 10/2006 |

* cited by examiner

PHASE CHANGE MATERIAL BASED TEMPERATURE SENSOR

CROSS REFERENCE TO RELATED APPLICATION

This application is a divisional of U.S. patent application Ser. No. 11/771,033, filed Jun. 29, 2007 the entire content and disclosure of which is incorporated herein by reference.

FIELD OF THE INVENTION

The present invention relates to semiconductor circuits, and particularly to phase change material based temperature sensor circuits and methods of operating and manufacturing the same.

BACKGROUND OF THE INVENTION

A phase change material typically refers to a chalcogenide material that has multiple crystalline states. Depending on a cooling rate from a liquid state, the chalcogenide material may form an amorphous chalcogenide glass or a chalcogenide crystal. The difference between the two states is physically characterized by presence or absence of a long range order. Further, the crystalline and amorphous states of the chalcogenide material have drastically different resistivity values. By manipulating the phase of the chalcogenide material, a binary data bit may be written into a phase change memory (PCM) device. By detecting the phase of the chalcogenide material, typically in the form of a resistivity measurement, the binary data bit stored in the PCM device may be read. Many types of PCM devices employing these methods are known in the art.

A typical chalcogenide material used in PCM devices is a germanium, antimony and tellurium compound commonly called GST ($Ge_2Se_2Te_5$). Along with oxygen, sulfur, selenium, and polonium, tellurium belongs to the chalcogen group, hence the name chalcogenide material.

Referring to FIG. 1, a typical prior art phase change memory (PCM) element structure comprises a dielectric layer 10, a heater element 20, and a phase change material element 30. The phase change material element 30 comprises a phase changing portion 32 and a crystalline portion 34. The phase changing portion 32 is hemispherical. While both the phase changing portion 32 and the crystalline portion 34 comprise the same phase change material, only the state of the phase changing portion 32 switches between an amorphous state and a crystalline state, while the crystalline portion stays crystalline.

In a prior art PCM device as shown in FIG. 1, to change the state of the phase change material into an amorphous state, a high current is passed between the heater element 20 and the phase change element 30 causing the temperature of the heater element 20 to rise above the melting point of the phase change material. The phase changing portion 32, as shown in FIG. 1, melts to form a melt phase change material portion 32a as shown in FIG. 2(a). Typically, phase changing chalcogenide materials become liquid at a relatively high temperature, e.g., above 600° C. The time constant for cooling is less than 5 nanoseconds. Upon cooling, the melt phase change material portion 32a becomes an amorphous phase change material portion 32b as shown in FIG. 2(b).

A crystalline phase change material having a low resistivity value may be formed by raising the temperature of the phase change material to a crystallization temperature, which is typically around 300° C. and is below the melting temperature. Upon heating of the phase changing portion 32 above a recrystallization temperature but below the melting temperature, the phase changing portion 32 becomes a crystallized phase change material portion 32c as shown in FIG. 2(c) irrespective of its prior state, i.e., the prior state may have been a crystalline state or an amorphous state. Upon cooling, the crystallized phase change material portion 32c stays as the same crystallized phase change material portion 32c, i.e., the crystalline order of the phase change material is maintained.

As the power density of semiconductor devices increases in successive semiconductor technology generations with continued scaling of dimensions, the operational temperature of semiconductor devices increases. Precise characterization of local operational temperature of semiconductor devices becomes important in modeling the performance of semiconductor circuits. Further, real time monitoring of the temperature of semiconductor devices during operation allows controlled modulation of the operational frequency of semiconductor devices to help reduce heat-related performance degradation. For example, if a portion of a chip becomes excessively hot enough to cause a degradation of overall chip performance, a controller may instruct the portion of the circuit around the hot spot to operate at a lower frequency until the local temperature returns to a normal level.

In addition, some reliability test conditions subject a semiconductor chip to an elevated ambient temperature while operating the chip under the assumption that the combination of the internal heating from the chip operation and the ambient bias would provide a stress condition that accelerates degradation of the chip at a calculated pace. Such a reliability testing often assumes that the physical temperature within the chip under stress would be at an estimated temperature. However, the true temperature of the chip may vary locally depending on the power density during the chip operation, which is hard to estimate accurately, rendering an estimated local internal temperature subject to error. Thus, temperature profiling of a chip during chip operation provides valuable information that may be advantageously used to improve chip performance or to improve validity of chip testing under stress.

Precise measurement of internal local temperature of a chip is in general difficult to achieve. While temperature profiling circuits utilizing temperature dependence of the band gap width in semiconductor materials are known, the magnitude of change in the band gap is small, thus requiring a rather complicated and bulky sensing circuit. Other mechanisms for detecting local chip temperature are known, but most of them require a complex signal amplification circuitry and are prone to noise due to small magnitude of the signal from temperature detection elements.

Therefore, there exists a need for a structure and circuit that provides a strong temperature dependent signal and reliable temperature sensing, and methods of operating and manufacturing the same.

SUMMARY OF THE INVENTION

The present invention addresses the needs described above by providing a phase change material based temperature sensor, a circuit that employs such a temperature sensor, and methods of operating and manufacturing the same.

Specifically, a block of the phase change material is formed on a semiconductor device with at least two contacts thereupon. The block of phase change material may be connected through metal wiring to input/output pads. The block of phase change material may also be connected to a resetting transistor that is capable of passing sufficient current to reset the phase of the phase change material to an amorphous state. Further, the block of phase change material may be connected to an internal resistance measurement circuit that can transmit measured resistance data to input/output pads either in an analog output format or in a digital output format. Depending on the ambient temperature, the resistance of the block of phase change material changes. By measuring a fractional resistance change compared to the resistance of the phase change material at a calibration temperature, the temperature of the region around the phase change material can be accurately measured. A logic decoder and an input/output circuit may be employed between the internal resistance measurement circuit and the input/output pads. A plurality of temperature sensing circuits containing phase change material blocks may be employed in a semiconductor chip to enable an accurate temperature profiling during chip operation.

According to an embodiment of the present invention, a semiconductor circuit comprises:
 a. a block of phase change material located in a semiconductor chip;
 b. at least two input/output pads on the semiconductor chip; and
 c. a metal wiring connecting the block and the at least two input/output pads.

The block of phase change material may abut a semiconductor component selected from the group consisting of source and drain regions, an emitter, a collector, a gate, a diode, and a resistor.

The block of phase change material may abut a semiconductor substrate such as a single crystalline silicon substrate.

A bottom surface of the block of phase change material may be located within in close proximity, e.g., 20 nm in one embodiment from a top surface of a semiconductor substrate.

According to anther embodiment of the present invention, a semiconductor circuit comprises:
 a. a block of phase change material located in a semiconductor chip;
 b. at least two input/output pads on the semiconductor chip;
 c. a metal wiring connecting the block and the at least two input/output pads; and
 d. a programming transistor connected to the block and the metal wiring, wherein the programming transistor is capable of resetting the block of phase change material to an amorphous state by passing current through the block.

According to yet another embodiment of the present invention, a semiconductor circuit comprises:
 a. a block of phase change material located in a semiconductor chip;
 b. at least two input/output pads on the semiconductor chip;
 c. a metal wiring connecting the block and the at least two input/output pads; and
 d. a resistance measurement circuit connected to the block and the at least two input/output pads.

The semiconductor circuit may comprise a programming transistor connected to the block and the metal wiring, wherein the programming transistor is capable of resetting the block of phase change material to an amorphous state by passing current through the resistor.

The semiconductor circuit may further comprise an amorphous state resetting circuit, wherein the amorphous state resetting circuit incorporates the programming transistor and controls current through the block.

The semiconductor circuit may further comprise a logic decoder and input/output circuit connected to the amorphous state resetting circuit, the resistance measurement circuit, and the at least two input/output pads.

According to another aspect of the present invention, a method of measuring an operating temperature of a semiconductor chip comprises:
 a. characterizing temperature dependency of the resistivity of a phase change material and generating a fitting function;
 b. designing and manufacturing a semiconductor circuit having a block of the phase change material and current measurement capability through the block;
 c. subjecting the semiconductor chip to an operating condition and measuring an operating condition current through the block;
 d. calculating an operation condition resistivity from the measured operating condition current; and
 e. calculating a temperature at which the fitting function generates the calculated operating condition resistivity.

The method may further comprise modifying the fitting function by matching the fitting function with a measured value of resistivity of the phase change material at a standard condition prior to calculating the temperature.

The measured value of resistivity at the standard condition may be derived from a standard condition current measurement through the block.

The fitting function may be a polynomial of temperature having at least one segment and defined below a crystallization temperature.

According to yet another aspect of the present invention, a method of forming a semiconductor structure comprises:
 a. forming at least one semiconductor component selected from the group consisting of source and drain regions, an emitter, a collector, a gate, a diode, and a resistor;
 b. depositing a layer of phase change material directly on the at least one semiconductor component;
 c. forming a block of the phase change material by lithographic patterning and etching of the layer of the phase change material;
 d. forming at least two metal contacts to the block of the phase change material;
 e. forming a metal wiring connecting the at least two metal contacts to at least two input/output pads.

The block of the phase change material may abut the at least one semiconductor component.

The method may further comprise forming an insulator layer such as a gate dielectric that is less than 20 nm thick, wherein the insulator layer abuts the at least one semiconductor component and the block of the phase change material.

A bottom surface of the block of phase change material may be located in close proximity, e.g., within about 20 nm from a top surface of a semiconductor substrate.

The method may further comprise forming at least another semiconductor circuit component which is capable of providing a programming current through the block of the phase change material, wherein the programming current melts the block and resets the state of the block to an amorphous state upon cooling.

The method may further comprise forming at least another semiconductor circuit component which is capable of providing a measurement current through the block of the phase change material, wherein the temperature of the block upon passing the measurement current increases by less than 10 degrees Celsius, and preferably by less than 3 degrees.

DETAILED DESCRIPTION OF THE INVENTION

Figure 1:
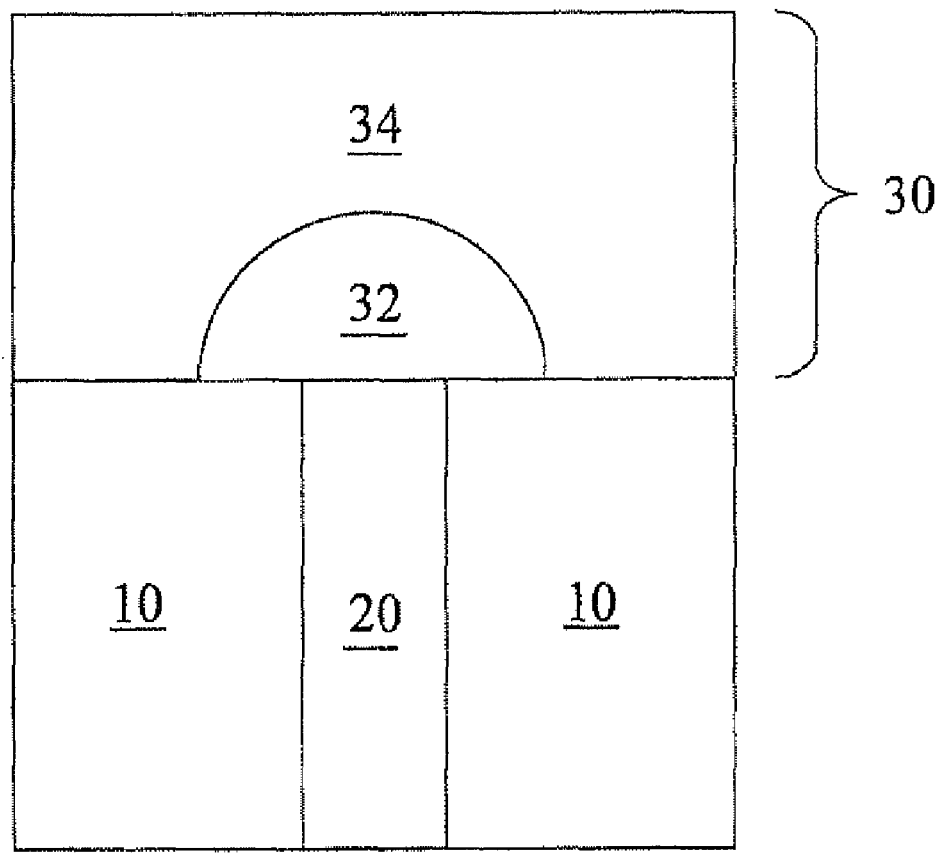
FIG. 1 shows a prior art phase change memory (PCM) element structure.
Figure 2A:
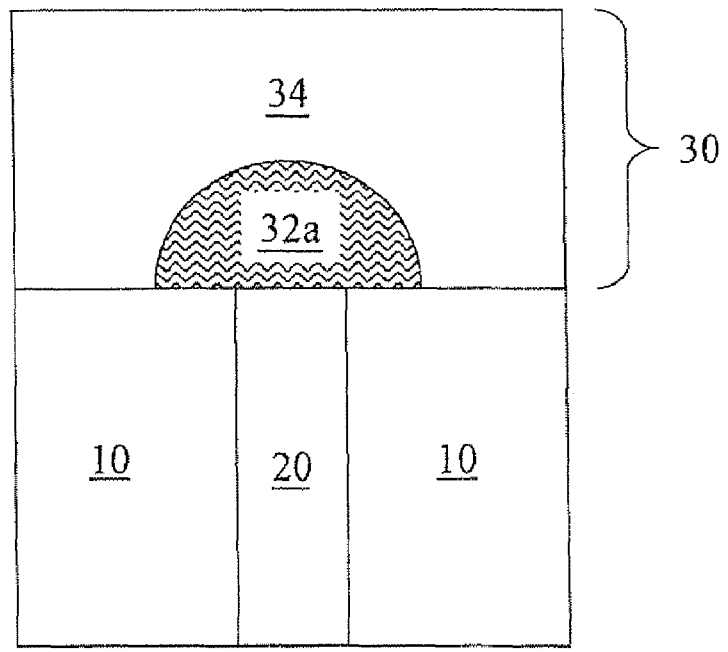
FIGS. 2(a)-2(c) are prior art phase change memory (PCM) element structures with different states of a phase changing portion.
Figure 2B:
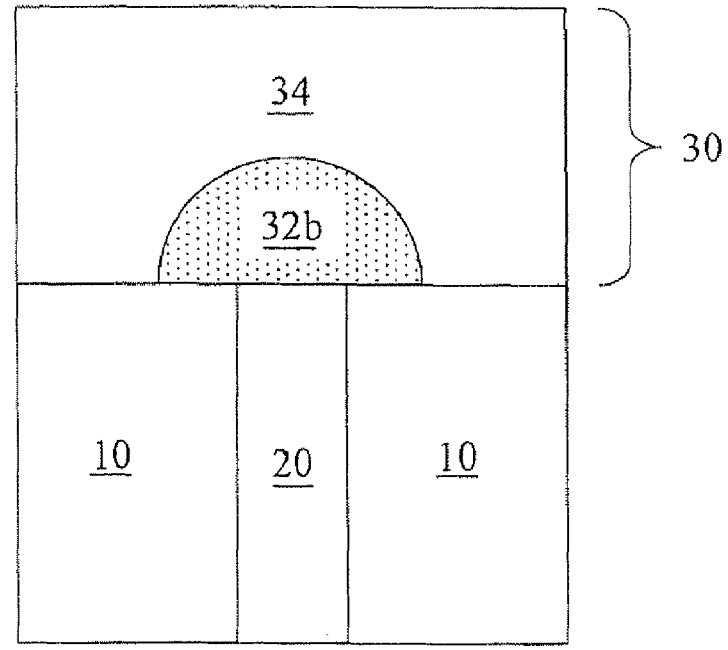
Figure 2C:
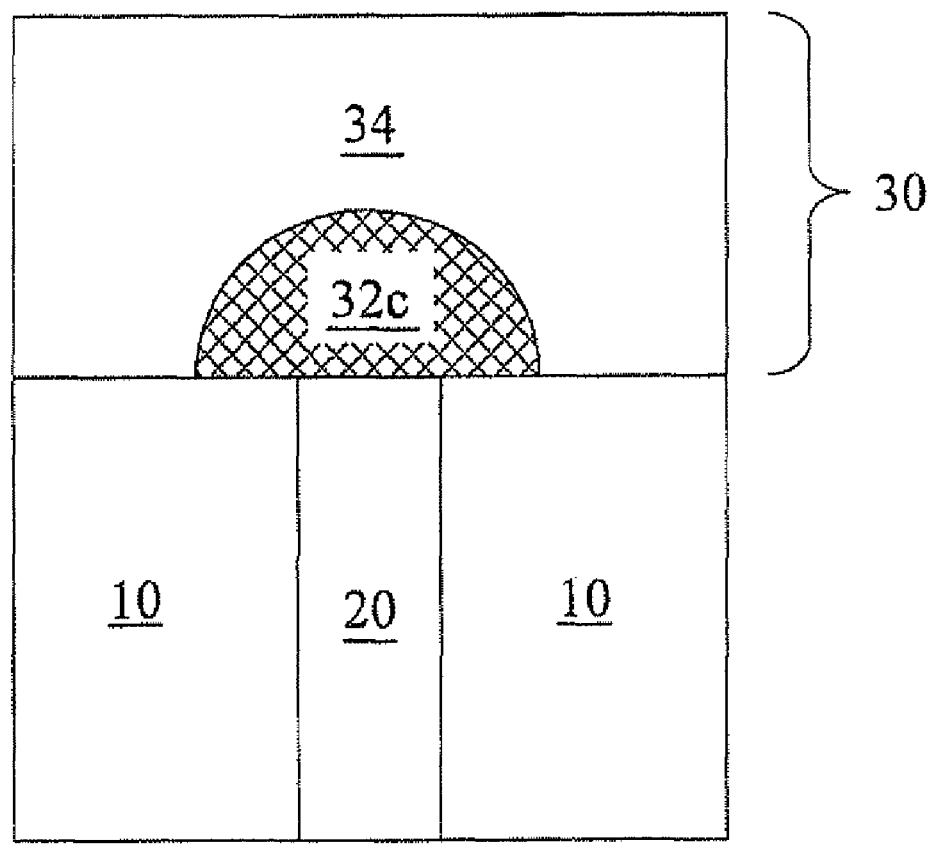

As stated above, the present invention relates to phase change material based temperature sensor circuits and methods of operating and manufacturing the same, which are now described in detail with accompanying figures. It is noted that like and corresponding elements are referred to by like reference numerals.

Figure 3:
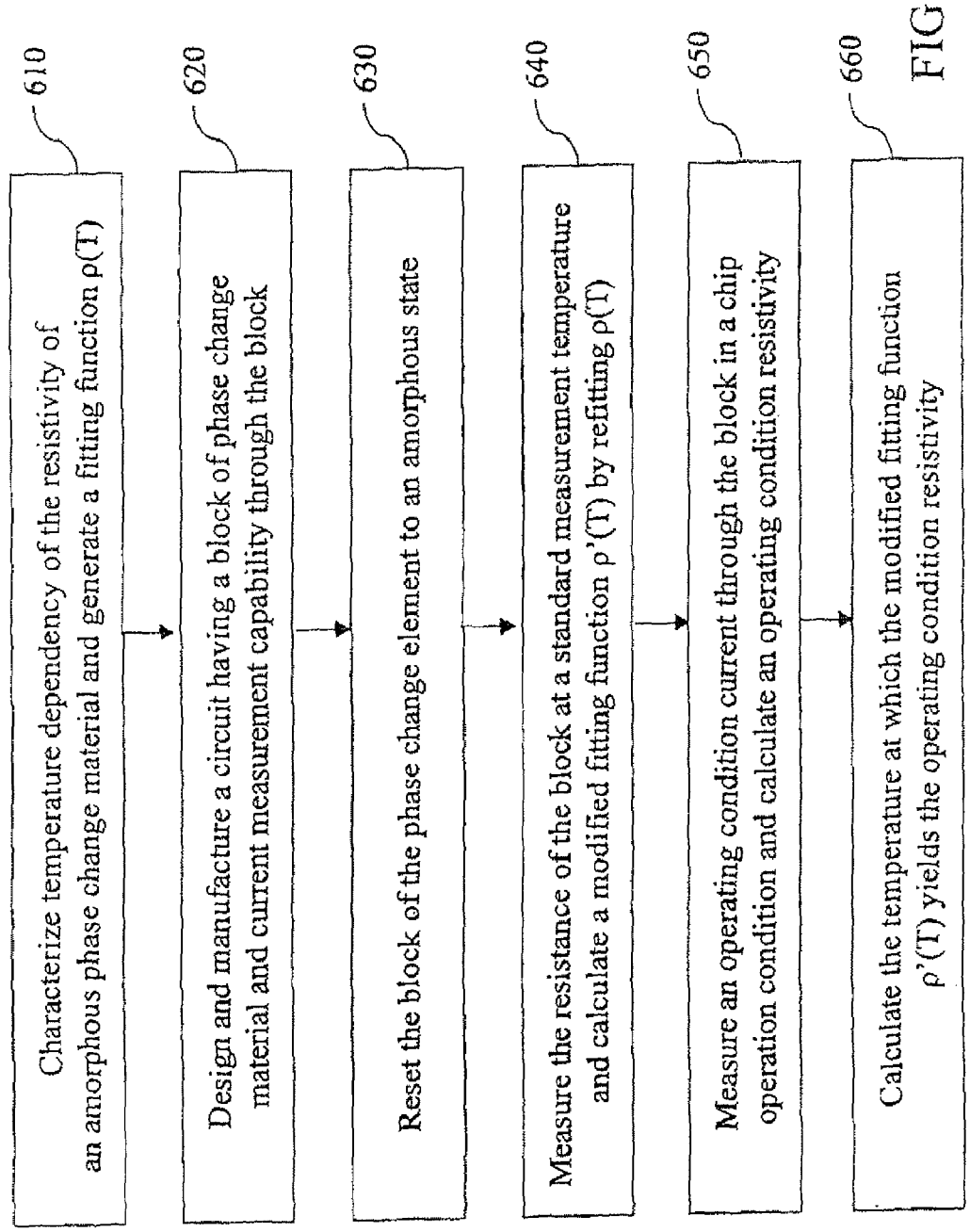
FIG. 3 is a flowchart for a method of extracting temperature from changes in the resistance of a block of an amorphous phase change material.

Referring to FIG. 3, a flowchart for a method of extracting temperature from changes in the resistance of a block of the phase change material in an amorphous state according to the present invention is shown. A phase change material that can be employed herein includes, but is not limited to, a chalcogenide alloy, which is an alloy of a chalcogen element with at least one non-chalcogen element, wherein the chalcogen element is selected from the group consisting of Te, Se, and S, and the at least one non-chalcogen element is selected from the group consisting of Ge, Sb, Bi, Pb, Sn, As, Si, P, Ga, In, and Ag. Illustrative examples of such chalcogenide alloys are GaSb, InSb, InSe, $Sb_2Te_3$, GeTe, $Ge_2Sb_2Te_5$, InSbTe, GaSbTe, $SnSb_2Te_4$, InSbGe, AgInSbTe, (GeSn)SbTe, GeSb(SeTe), and $Te_{81}Ge_{15}Sb_2S_2$.

Referring to a first part of step 610 of the flowchart in FIG. 3, temperature dependency of an amorphous phase change material is characterized. The present invention utilizes temperature dependent variations in the resistivity of an amorphous phase change material.

Figure 4:
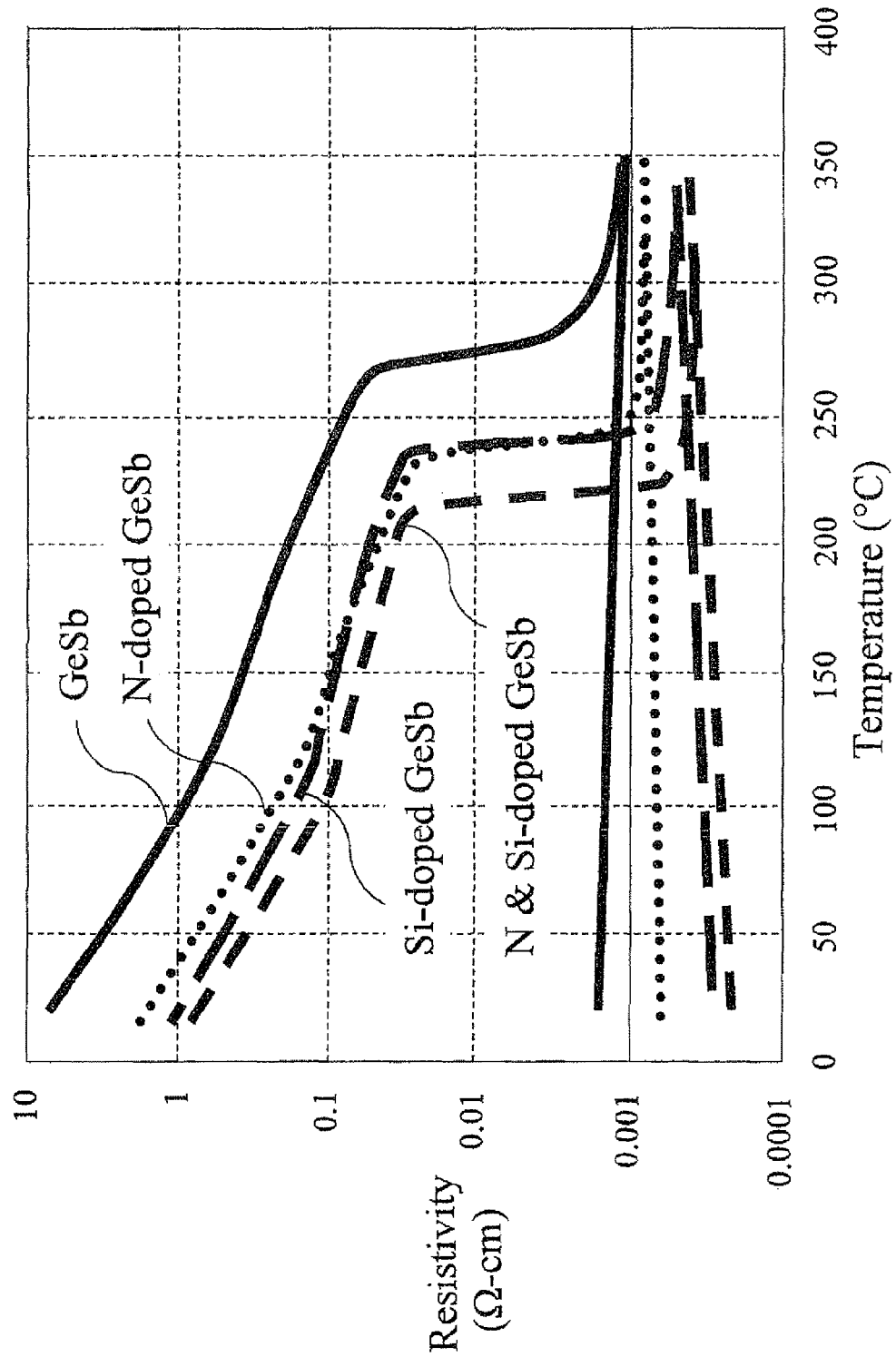
FIG. 4 shows temperature dependency of the resistivity of selected phase change materials.

Referring to FIG. 4, temperature dependent resistivity is shown for exemplary phase change materials of GeSb, nitrogen-doped GeSb, silicon-doped GeSb, and nitrogen-and-silicon-doped GeSb. An amorphous phase change material has a room temperature resistivity of about 1 to 10 Ω-cm. As the temperature increases between the room temperature and a crystallization temperature, the resistivity of the amorphous phase change material decreases by about two orders of magnitude. Around a crystallization temperature between 200° C. and 300° C., the resistivity of the phase change material undergoes a drastic decrease of about two orders of magnitude. The resistivity of the phase change material stabilizes around 350° C. Upon cooling, the resistivity of the phase change material maintains a steady value around 0.001 Ω-cm since a crystalline state is maintained.

Typical phase change memory devices change the state of a phase change material between an amorphous state and a crystalline state and employ a sensing circuit that determines the state of the phase change material with a binary logic by comparing a measured value of the resistivity of the phase change material with a reference value which is set between a crystalline state value and an amorphous state value. In contrast, the present invention maintains the state of a phase change material in an amorphous state. A sensing circuitry measures the values of the resistivity of the phase change material to determine the temperature of the ambient of the phase change material.

Referring to a second part of the step 610 in FIG. 3, a fitting function ρ(T) is generated from the portion of the resistivity curve of the amorphous phase change material below a crystallization temperature.

Figure 5A:
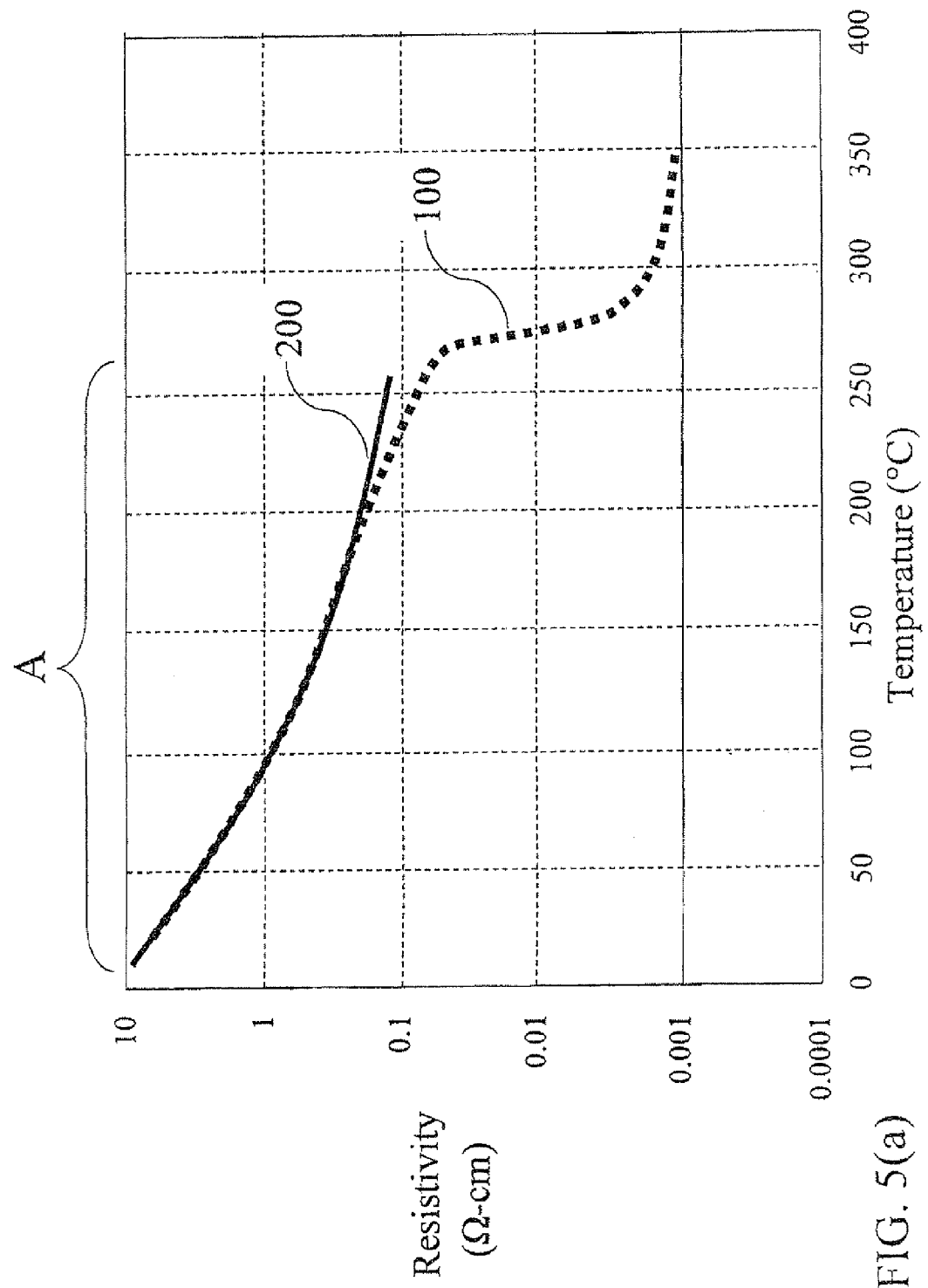
FIG. 5(a) shows quadratic fitting curve 200 for the resistivity of an exemplary amorphous phase change material.

Referring to FIG. 5(a), the amorphous portion A of an exemplary resistivity curve 100 below a crystallization transition temperature of about 275° C. may be approximated with a quadratic fitting function 200. The range of fitting may be adjusted to maximize accuracy of fitting in the application range.

Figure 5B:
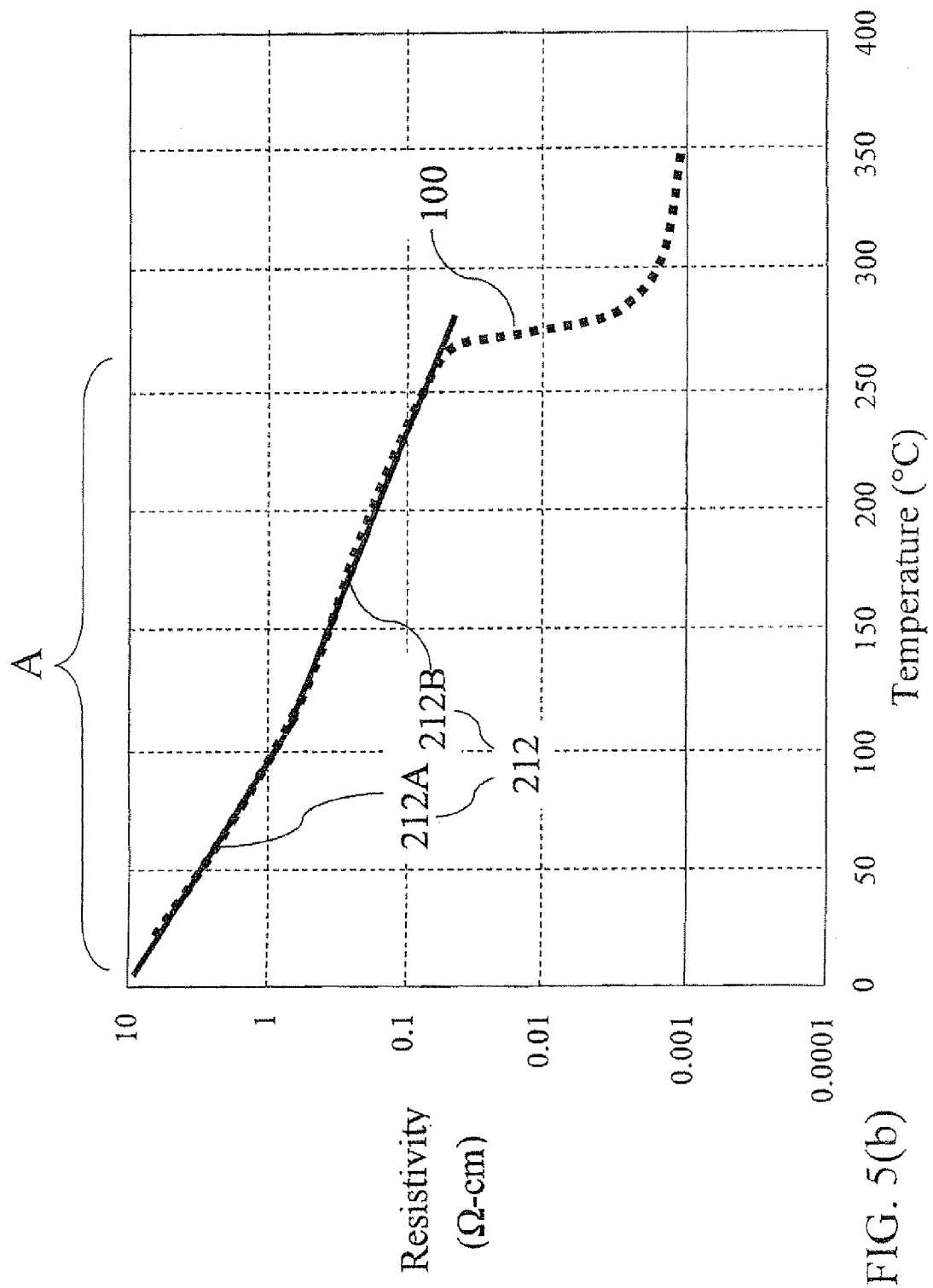
FIG. 5(b) shows a bi-sectional linear fitting curve 212 for the resistivity of an exemplary amorphous phase change material.

Referring to FIG. 5(b), the amorphous portion A of the exemplary resistivity curve 100 may be broken into multiple segments and fitted by multiple linear segment-dependent fitting functions. A first segment linear fitting function 212A and a second segment linear fitting function 212B collectively form a composite linear fitting function 212 below the crystallization temperature. In general, the fitting function may be a polynomial of temperature having at least one segment and defined below the crystallization temperature. A logarithm or an exponential function may be employed to improve fitting of the exemplary resistive curve 100.

Referring to step 620 of the flowchart in FIG. 3, a semiconductor circuit having a phase change element, or a block of the phase change material, and current measurement capability through the phase change element is designed and manufactured.

Figure 6:
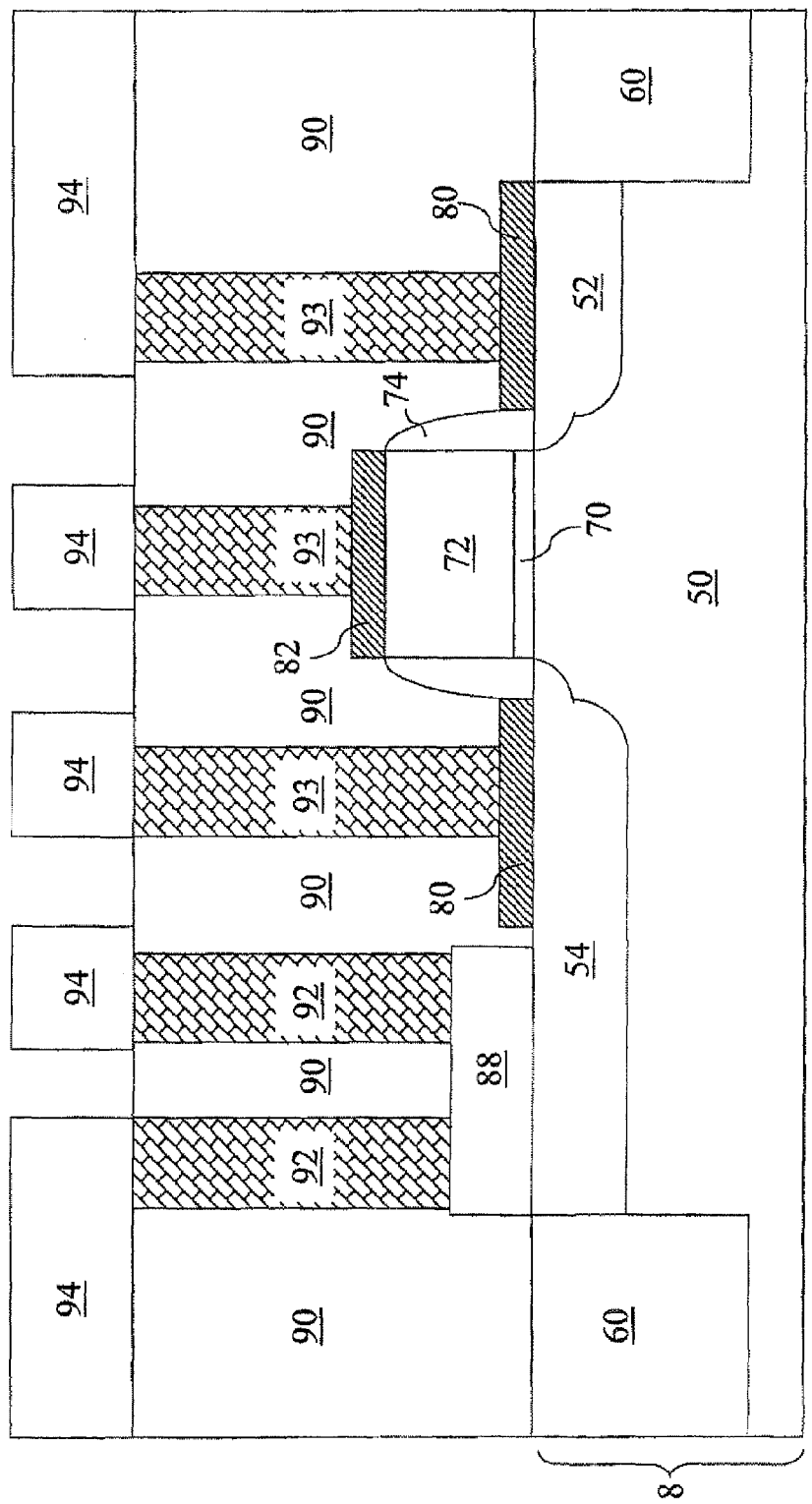
FIG. 6 is a vertical cross-sectional view of a first exemplary structure according to the present invention.

Referring to FIG. 6, a first exemplary structure according to the present invention comprises semiconductor components of a metal-oxide-semiconductor field effect transistor (MOSFET). The MOSFET comprises a body 50, a source 52, a drain 54, a gate dielectric 70, a gate semiconductor 72, a gate spacer 74, a source and drain silicide 80, and a gate silicide 82. Shallow trench isolation 60 is formed within a semiconductor substrate 8, which also contains the body 50, the source 52, and the drain 54 of the MOSFET. In general, at least one semiconductor component is formed on the semiconductor substrate 8. The at least one semiconductor component may be, but is not limited to, source and drain regions, an emitter, a collector, a gate, a diode, and a resistor.

A layer of phase change material (not shown) is deposited on the at least one semiconductor component. The layer of the phase change material may comprise any of the phase change material described above. In the process of forming the first exemplary structure, the layer of the phase change material may be deposited prior to or after the formation of source and drain silicide 80 and the gate silicide 82. A block 88 of the phase change material is formed on the at least one semiconductor component, e.g., on the drain 54 of the MOSFET, by lithographic patterning and etching of the layer of the phase change material. The block 88 may abut the at least one semiconductor component, e.g., the drain 54 of the MOSFET. A middle-of-line (MOL) dielectric layer 90 is formed over the semiconductor substrate 8 and over the block 88 of the phase change material. Contact via holes are formed within the MOL dielectric layer 90 and filled with metal to form at least two metal contacts 92 connected to the block 88 of the phase change material. Other metal contacts 93 may be formed to the at least one semiconductor component, e.g., the various components of the MOSFET. A metal wiring 94 is formed over the MOL dielectric and within back-end-of-line (BEOL) dielectric layers.

The size of the block 88 of the phase change material may be limited by the features of the block 88, i.e., the number of metal contacts 92 to be formed thereupon. The smallest dimension of the block 88 may be limited by the critical dimension of lithography tools, i.e., the minimum size of a printable image. The lateral dimensions, e.g., a length and a width, of the block 88 of the phase change material may be in the range from about 50 nm to about 200 nm. The thickness of the block 88 of the phase change material may be in the range from about 20 nm to about 200 nm.

At least two input/output pads (not shown in FIG. 6) are formed on a top BEOL dielectric layer to enable measurement of resistance of the block 88 of the phase change material. The metal wiring 94 connects the least two metal contacts to at least two input/output pads. The metal wiring 94 may directly connect the at least two metal contacts 92 to the at least two input/output pads. Alternatively, the metal wiring 94 may connect the at least two metal contacts 92 to a control circuit, which may contain such circuits as a resistance measurement circuit, an amorphous state resetting circuit containing a programming transistor, and/or a logic decoder and input/output circuit. In this case, the at least two input/output pads may be directly connected to the control circuit. Analog voltages or logic control voltages may be applied to the at least two input/output pads to enable resistance measurement of the block 88 of the phase change material.

Figure 7:
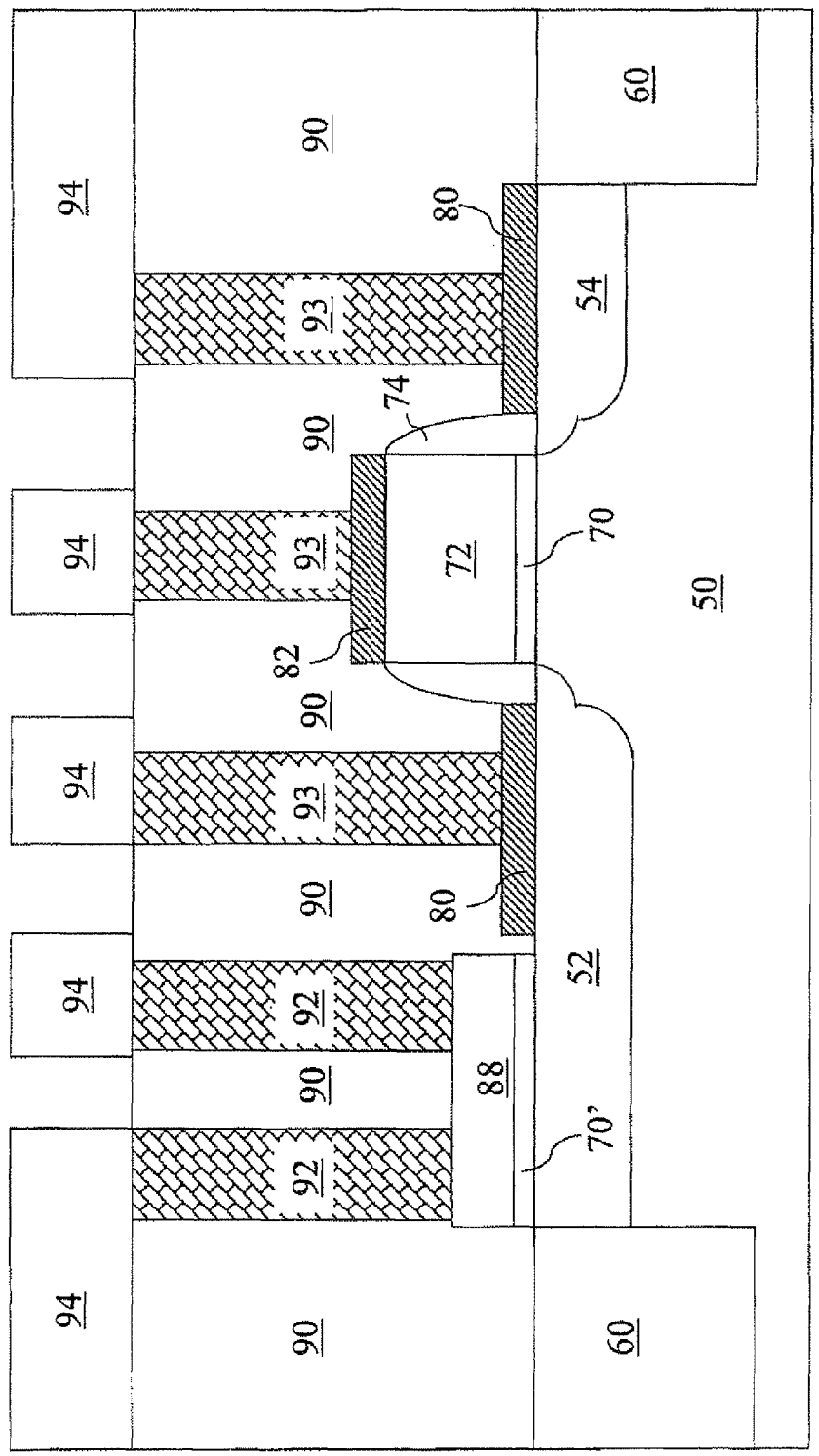
FIG. 7 is a vertical cross-sectional view of a second exemplary structure according to the present invention.

Referring to FIG. 7, a second exemplary structure according to the present invention comprises semiconductor components of a metal-oxide-semiconductor field effect transistor (MOSFET) as in the first exemplary structure. The block 88 of the phase change material is located directly on a dielectric layer 70', which may comprise the same material as the gate dielectric 70 and formed during the same processing step as the gate dielectric 70. The thickness of the dielectric layer 70' is typically in the range from 0 nm to about 20 nm, and may be the same as the thickness of the gate dielectric 70. A bottom surface of the block 88 of the phase change material is located in close proximity, e.g., within 20 nm from a top surface of the semiconductor substrate 8. The dielectric layer 70' provides electrical isolation between the at least one semiconductor component and the block 88 of the phase change material.

It is noted herein that the block 88 of the phase change material is located either directly on a front-end-of-line (FEOL) semiconductor component such as source and drain regions, an emitter, a collector, a gate, a diode, and a resistor, or located within a close proximity of the FEOL semiconductor component, e.g., within 20 nm therefrom. Typical middle-of-line dielectric layer 90, within which metal contacts (92, 93) are formed, has a thickness in the range from about 200 nm to about 500 nm Therefore, the block 88 of the phase change material is located beneath a top surface of the MOL dielectric, or beneath a bottom surface of the lowest level metal wiring, i.e., metal wiring closest to the semiconductor substrate 8.

The block 88 of the phase change material contacts at least two metal contacts 92 to enable current measurement capability. The number of contacts to the block 88 may be increased as needed to enable the level of accuracy in the resistance measurement of the block 88 of the phase change material.

Figure 8:
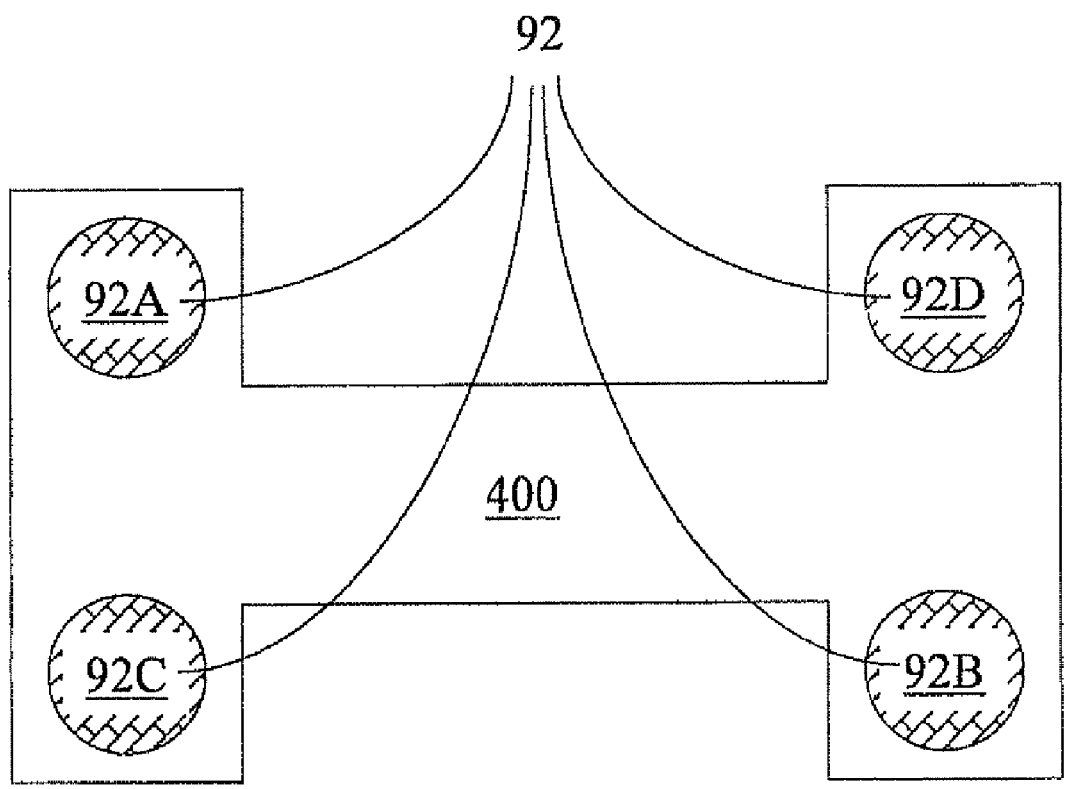
FIG. 8 is a top-down view of an exemplary shape of a phase change material block for four-point resistance measurement according to the present invention.

Referring to FIG. 8, a top-down view of an exemplary shape of a phase change material block 400 shows four metal contacts 92 to enable four-point resistance measurement. As is well known in the art, the resistance of the phase change material block 400 may be measured by forcing a certain level of current between a first metal contact 92A and a second metal contact 92B and measuring the voltage differential between a third metal contact 92C and a fourth metal contact 92D.

Referring to step 630 of the flowchart in FIG. 3, the block 88 of the phase change material is reset to an amorphous state after completion of manufacturing of the semiconductor chip. Typical semiconductor manufacturing process employs many back-end-of-line processing steps that are performed at a temperature around or above 400° C. for at least several minutes, or even for hours. Such temperature cycling has an effect of an anneal that converts any amorphous state of the block 88 of the phase change material into a crystalline state. To utilize temperature dependency of the amorphous state of the phase change material, the block 88 of the phase change material is reset to an amorphous state. The resetting is performed after the last thermal cycling that exceeds the crystallization temperature of the phase change material, and may be performed at a testing step prior to or after dicing and packaging of the semiconductor chip.

Figure 9:
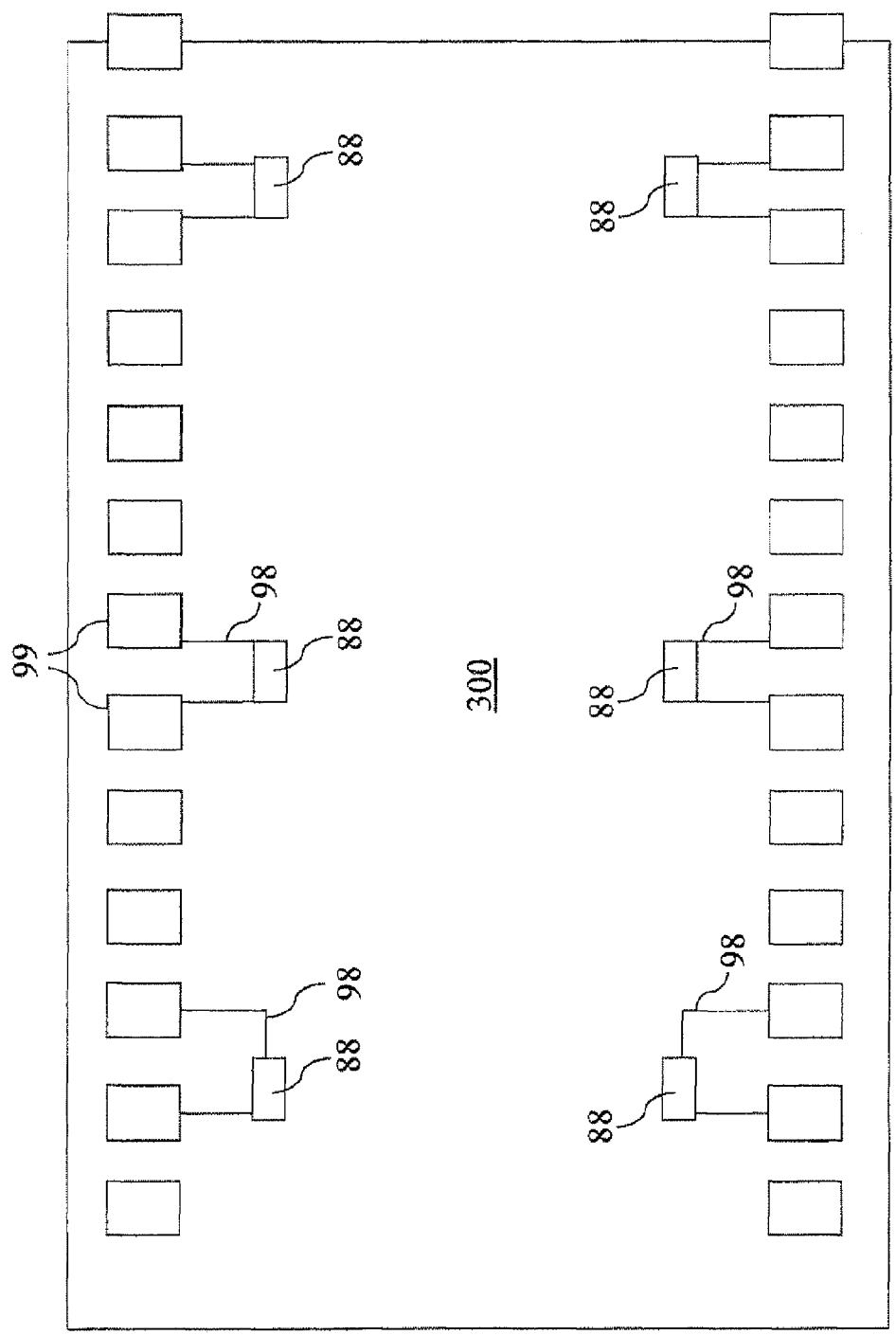
FIG. 9 is a top down view of a first exemplary semiconductor chip according to an embodiment of the present invention.

Referring to FIG. 9, a top down view of a first exemplary semiconductor chip 300 according to an embodiment of the present invention is shown with schematic representations of blocks 88 of the phase change material and a direct metal wiring 98, which is connected to multiple pairs of input/output pads 99. In this embodiment, the direct metal wiring 98 directly connects each of the blocks 88 of the phase change material to the at least two input/output pads 99. The resetting of the blocks 88 of the phase change material may be performed by directly connecting the blocks 88 of the phase change material to the at least two input/output pads 99 through the metal wiring 94. In this case, a pulsed voltage is applied across a pair of pads such that a programming current passes through the block 88 of the phase change material and melts the phase change material. As the pulsed voltage is turned off, the block 88 of the phase change material cools rapidly to reset the phase change material into an amorphous state. Resistance measurement of the block 88 may be performed by passing current through a series connection of an input/output pad 99, a block 88, and another input/output pad 99.

Figure 10:
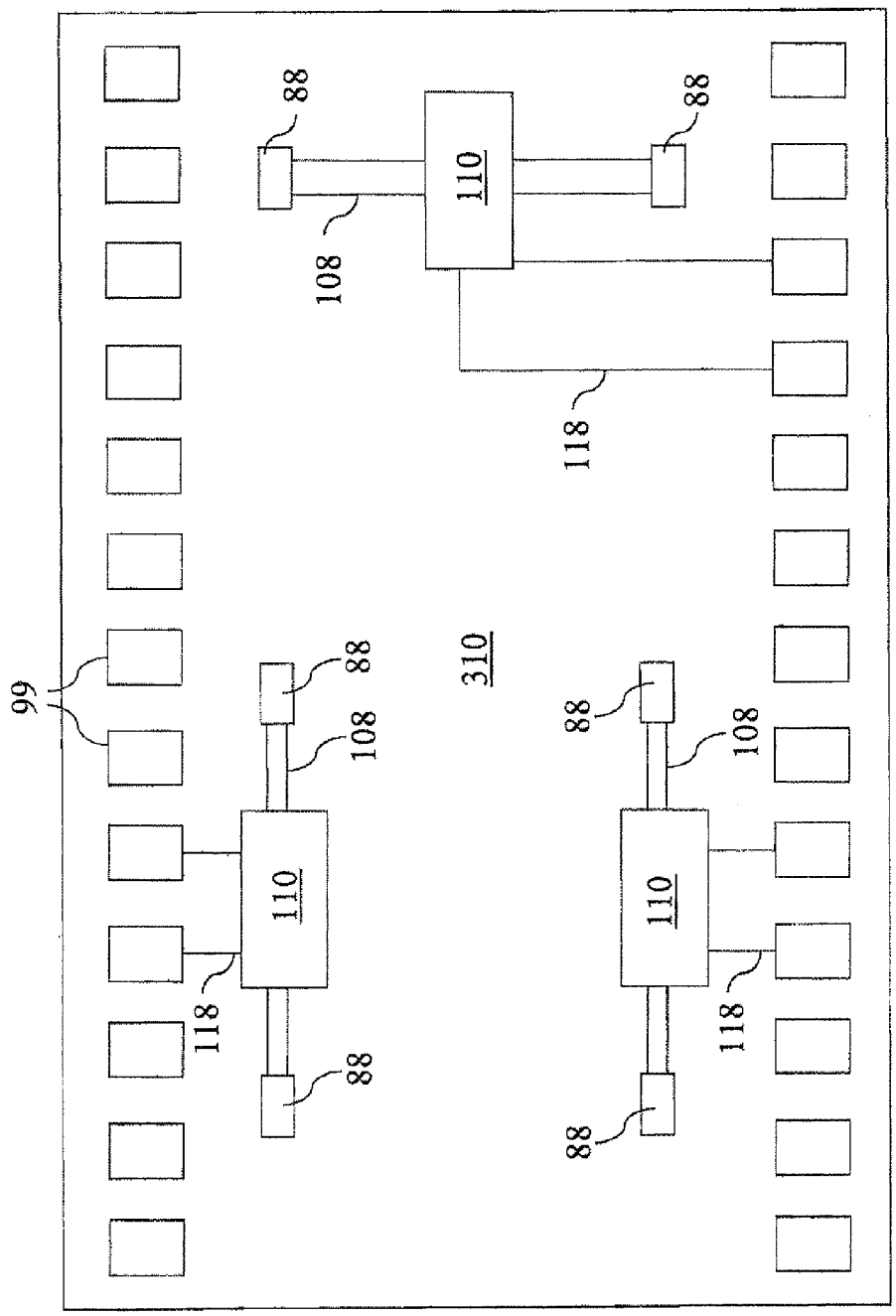
FIG. 10 is a top down view of a second exemplary semiconductor chip according to another embodiment of the present invention.

Referring to FIG. 10, a top down view of a second exemplary semiconductor chip 310 according to another embodiment of the present invention is shown with schematic representations of blocks 88 of the phase change material, a control circuit 110 connected to the blocks 88 through a first metal wiring 108, and a second metal wiring 118 connecting the control circuit 110 and multiple pairs of input/output pads 99. The resetting of the blocks 88 of the phase change material may be performed by supplying current to the blocks 88 through the at least two input/output pads 99. More preferably, however, the resetting of the blocks 88 of the phase change material may be performed by a programming transistor included in the control circuit 110, which is controlled by external signals from the input/output pads 99. Typically, a pulsed current is supplied to the block 88 and melts the phase change material, which resets into an amorphous state upon cooling. Resistance measurement may also be performed by the control circuit 110 upon application of an external signal to the input/output pads 99.

Figure 11:
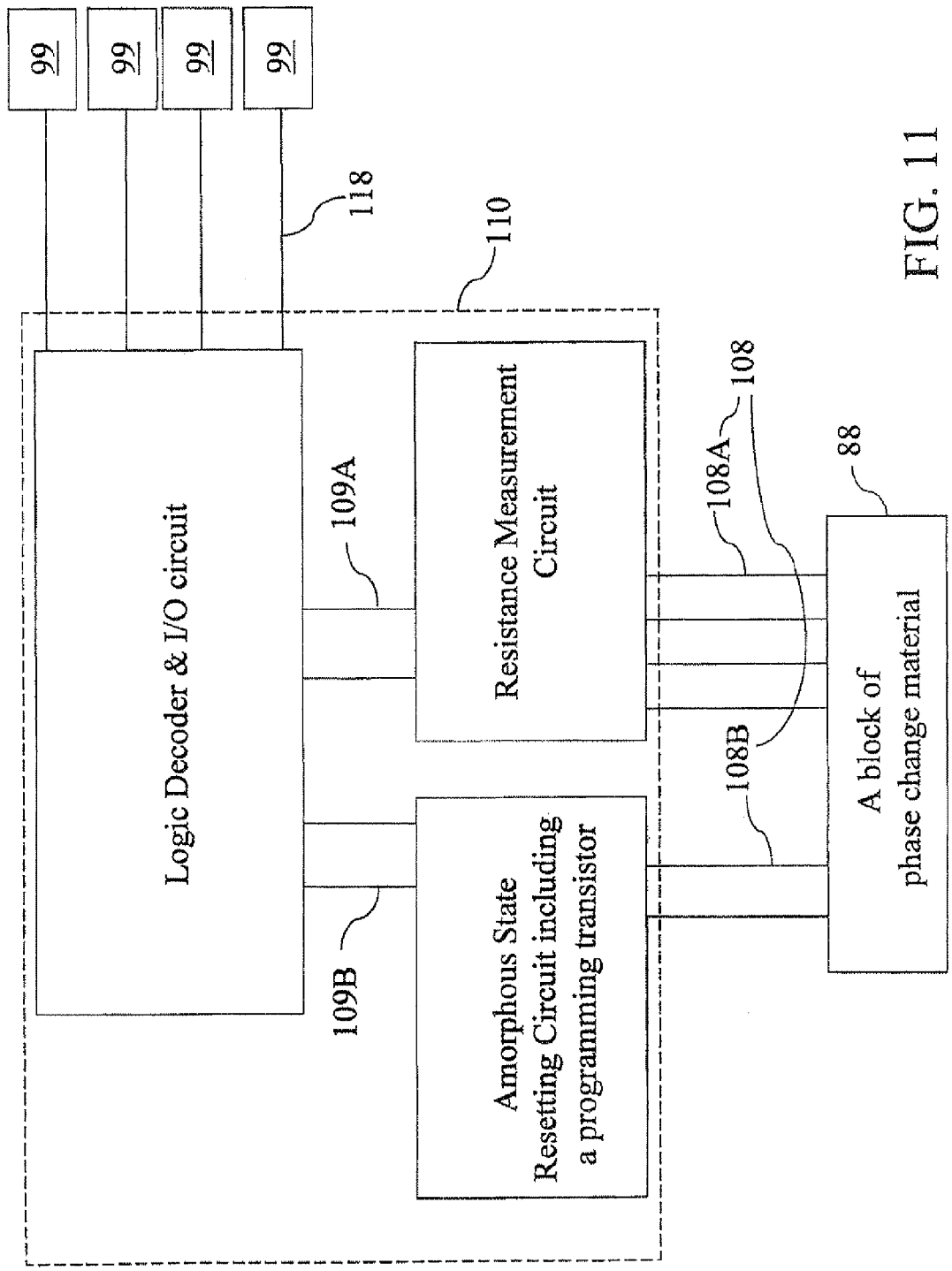
FIG. 11 is a schematic of an exemplary semiconductor circuit according to the present invention.

Referring to FIG. 11, an exemplary semiconductor circuit that may be employed in the second exemplary semiconductor chip 310 of FIG. 10 comprises a control circuit 110, a block 88 of the phase change material to the control circuit through a first metal wiring 108, and input/output pads 99 connected to the control circuit through a second metal wiring 118.

The control circuit 110 comprises at least a resistance measurement circuit that enables resistance measurement through the block 88 of the phase change material. A first subset 108A of the first metal wiring 108 supplies current or voltage across the block 88 of the phase change material and carries output current or voltage from the block 88 of the phase change material to the resistance measurement circuit. The output current or voltage is converted into the resistance of the phase change material. Resistivity of the phase change material in the block 88 is calculated from the known geometry of the block 88.

A programming transistor may also be provided in the control circuit 110. The programming transistor is connected to the block 88 of the phase change material and the second subset 108B of the first metal wiring 108. The programming transistor is capable of passing sufficient current through the block 88 of the phase change material to reset the block 88 to an amorphous state.

Preferably, an amorphous state resetting circuit is also provided within the control circuit 110. The amorphous state resetting circuit incorporates the programming transistor and controls current through the block 88 during the resetting of the block 88 into an amorphous state.

A logic decoder and input/output circuit may also be provided within the control circuit 110. The logic decoder and input/output circuit is connected to the resistance measurement circuit through a first internal metal wiring 109A, to the amorphous state resetting circuit through a second internal wiring 109B, and to the at least two input/output pads 99 through the second metal wiring 118.

Referring to step 640 of the flowchart in FIG. 3, the resistance of the block 88, which is in an amorphous state, is measured at a standard measurement temperature to calibrate the resistivity of the phase change material. The standard measurement temperature may be a room temperature. Typically, the semiconductor chip is placed in a low power mode, such as a standby mode, to minimize an unintended increase in ambient temperature around the block 88 of the phase change material. Alternatively, the standard temperature may be any temperature at which the variations in temperature in the semiconductor chip is minimized for the sake of calibration of the resistance of the phase change material. The current through the block 88 during the resistance measurement at a standard measurement temperature is small enough not to disturb the system significantly, i.e., the temperature of the block 88 upon passing the measurement current increases by less than 10 degrees Celsius, and preferably by less than 3 degree Celsius, and most preferably by less than 1 degree Celsius.

Figure 12:
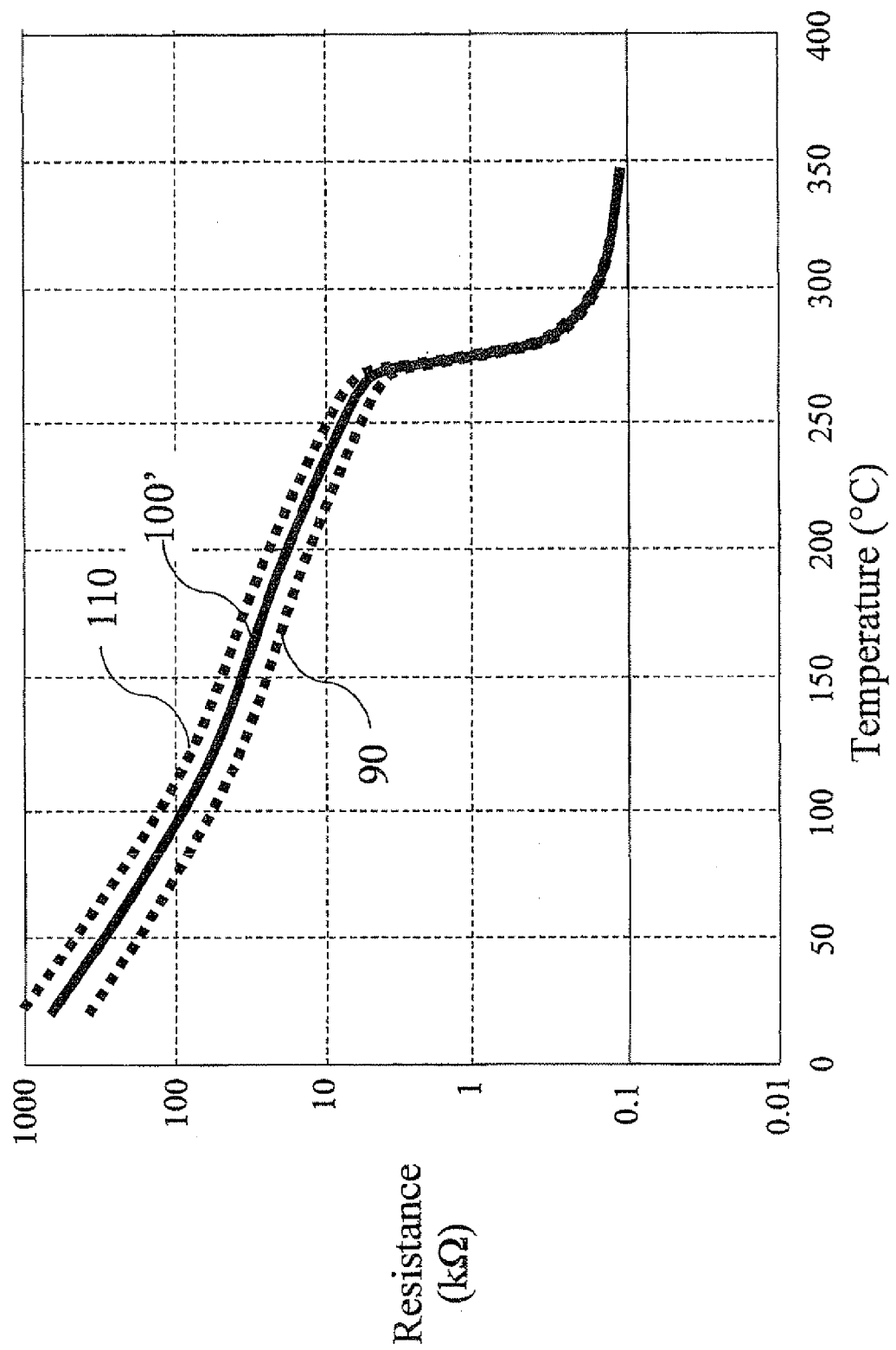
FIG. 12 shows an exemplary variation of the resistance of a 100 nm×100 nm×100 nm cube of a phase change material due to process variation.

The variations in the resistance of the blocks 88 of the phase change material as measured at the standard measurement temperature may be caused by process variations, such as variations in the composition of the phase change material and/or variations in the dimensions of the phase change material. Referring to FIG. 12, exemplary variations in the resistance of a cubic block 88 of a phase change material having a length, a width, and a height of 100 nm is shown. In this example, process variations produce a nominal resistivity curve 100', a minimum resistivity curve 90, and a maximal resistivity curve 110. By measuring the resistance of the block 88 of the phase change material at the standard measurement temperature, the impact of the process variations on the resistance of the blocks 88 is calibrated. Thus a modified fitting function $\rho'(T)$ is calculated by refitting the original fitting function $\rho(T)$ to the measured resistivity.

Referring to step 650 of the flowchart in FIG. 3, the semiconductor chip is placed in a chip operating condition. The chip operating condition may be a normal chip operating condition as the semiconductor chip may normally operate in, or alternatively, an accelerated operating condition that simulates the condition of the chip after an extended usage, such as a reliability testing. An operating condition current is measured through the block 88 while the semiconductor chip is in the chip operating condition. The measurement may be a direct measurement of resistance through the at least two input/output pads 99. Alternatively, the control circuit 110 may be employed to measure the operating condition current. The operating condition resistivity is calculated from the measured value of the operating condition current. The current through the block 88 during the resistance measurement at the chip operating condition is small enough not to disturb the system significantly, i.e., the temperature of the block 88 upon passing the measurement current increases by less than 10 degrees Celsius, and preferably by less than 3 degree Celsius, and most preferably by less than 1 degree Celsius.

Referring to step 660 of the flowchart in FIG. 3, the local ambient temperature of the chip around each block 88 of the phase change material is calculated from the operating current resistivity by finding the temperature at which the modified fitting function $\rho'(T)$ yields the operating condition resistivity. By placing multiple blocks 88 of the phase change material within a semiconductor chip, the temperature of the chip is profiled for chip operating conditions, which may be used to assess whether any portion of the semiconductor chip is generating excessive heat, whether any portion of the semiconductor chip may improve overall performance by a temporary slowdown of the portion, and/or whether any chip stressing is applying excessive thermal stress on a portion of the semiconductor chip.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of measuring an operating temperature of a semiconductor chip comprising:

characterizing temperature dependency of the resistivity of an amorphous phase change material and generating a fitting function;

designing and manufacturing a semiconductor circuit having a block of said amorphous phase change material and current measurement capability through said block;

subjecting said semiconductor chip to an operating condition and measuring an operating condition current through said block;

calculating an operation condition resistivity from said measured operating condition current; and calculating a temperature at which said fitting function generates said calculated operating condition resistivity, wherein said semiconductor circuit includes a semiconductor structure comprising:
- a semiconductor device including a component located within a semiconductor substrate, wherein said component comprises a same semiconductor material as said semiconductor substrate, said block of said amorphous phase change material contacting a surface of said component and embedded in a dielectric layer located over said semiconductor substrate;
- a first metal contact that is in direct contact with one portion of said block and embedded in said dielectric layer; and
- a second metal contact that is in direct contact with another portion of said block and embedded in said dielectric layer.

2. The method of claim 1, further comprising modifying said fitting function by matching said fitting function with a measured value of resistivity of said phase change material at a standard condition prior to calculating said temperature.

3. The method of claim 2, wherein said measured value of resistivity at said standard condition is derived from a standard condition current measurement through said block.

4. The method of claim 1, wherein said fitting function is a polynomial of temperature having at least one segment and defined below a crystallization temperature.

5. The method of claim 1, further comprising resetting said block to an amorphous state prior to said subjecting of said semiconductor chip to said operating condition.

6. The method of claim 1, wherein said semiconductor structure further comprises:
- a metal wiring configured to enable measurement of a resistance of said block;
- a sensing circuitry that includes a resistance measurement circuit that is connected to said metal wiring and is configured to measure a resistance of said block by measuring said current, wherein said sensing circuitry determines a local ambient temperature of said block based on said measured resistance during operation of said semiconductor chip.

7. The method of claim 1, wherein said block of phase change material contacts a top surface of a semiconductor component selected from the group consisting of source and drain regions, an emitter, a collector, a gate, a diode.

8. The method of claim 1, wherein said semiconductor device is a metal-oxide-semiconductor field effect transistor (MOSFET).

9. The method of claim 8, wherein said component is a source region or a drain region of said MOSFET.

10. A method of measuring an operating temperature of a semiconductor chip comprising:
- characterizing temperature dependency of the resistivity of an amorphous phase change material and generating a fitting function;
- designing and manufacturing a semiconductor circuit having a block of said amorphous phase change material and current measurement capability through said block;
- subjecting said semiconductor chip to an operating condition and measuring an operating condition current through said block;
- calculating an operation condition resistivity from said measured operating condition current; and
- calculating a temperature at which said fitting function generates said calculated operating condition resistivity, wherein said semiconductor circuit as manufactured includes a semiconductor structure comprising:
  - a metal-oxide-semiconductor field effect transistor (MOSFET) located on a semiconductor substrate and including a gate dielectric that contacts a top surface of said semiconductor substrate;
  - said block of said amorphous phase change material contacting a surface of a semiconductor device component located within a semiconductor substrate and said block embedded in a dielectric layer located over said semiconductor substrate; and
  - another dielectric layer contacting an entirety of a bottom surface of said block of phase change material and electrically isolating said block of phase change material from any semiconductor device located directly underneath said block of phase change material.

11. The method of claim 10, further comprising modifying said fitting function by matching said fitting function with a measured value of resistivity of said phase change material at a standard condition prior to calculating said temperature.

12. The method of claim 11, wherein said measured value of resistivity at said standard condition is derived from a standard condition current measurement through said block.

13. The method of claim 10, wherein said fitting function is a polynomial of temperature having at least one segment and defined below a crystallization temperature.

14. The method of claim 10, further comprising resetting said block to an amorphous state prior to said subjecting of said semiconductor chip to said operating condition.

15. The method of claim 10, wherein said semiconductor structure further comprises:
- a first metal contact that is in direct contact with one portion of said block and embedded in said dielectric layer; and
- a second metal contact that is in direct contact with another portion of said block and embedded in said dielectric layer.

16. The method of claim 15, wherein said semiconductor structure further comprises:
- a metal wiring configured to enable measurement of a resistance of said block;
- a sensing circuitry that includes a resistance measurement circuit that is connected to said metal wiring and is configured to measure a resistance of said block by measuring said current, wherein said sensing circuitry determines a local ambient temperature of said block based on said measured resistance during operation of said semiconductor chip.

17. The method of claim 10, wherein said other dielectric layer is in direct contact with said top surface of said semiconductor substrate, wherein said other dielectric layer and said gate dielectric have a same composition and a same thickness.

18. The method of claim 17, wherein said other dielectric layer is in direct contact with a source region or a drain region of a MOSFET, and does not directly contact said gate dielectric.

19. The method of claim 18, wherein first metal contact and said second metal contact are in direct contact with a topmost surface of said block.

* * * * *